United States Patent
Hara et al.

(10) Patent No.: US 11,152,225 B1
(45) Date of Patent: Oct. 19, 2021

(54) METHOD FOR PRODUCING SEMICONDUCTOR ELEMENT

(71) Applicant: TOYOTA JIDOSHA KABUSHIKI KAISHA, Toyota (JP)

(72) Inventors: Toshimasa Hara, Nisshin (JP); Katsunori Danno, Obu (JP); Motohisa Kado, Gotemba (JP); Hayate Yamano, Susono (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 17/179,533

(22) Filed: Feb. 19, 2021

(30) Foreign Application Priority Data

Apr. 16, 2020 (JP) .............................. JP2020-073653

(51) Int. Cl.
*H01L 21/00* (2006.01)
*H01L 21/385* (2006.01)
*H01L 21/477* (2006.01)
*H01L 21/426* (2006.01)

(52) U.S. Cl.
CPC .......... *H01L 21/385* (2013.01); *H01L 21/426* (2013.01); *H01L 21/477* (2013.01)

(58) Field of Classification Search
CPC .... H01L 21/385; H01L 21/426; H01L 21/477
See application file for complete search history.

(56) References Cited

U.S. PATENT DOCUMENTS

2004/0102004 A1* 5/2004 Arai .................. H01L 27/11568
438/257
2016/0042949 A1 2/2016 Sasaki et al.

FOREIGN PATENT DOCUMENTS

JP          2016039194 A          3/2016

* cited by examiner

*Primary Examiner* — Reema Patel
(74) *Attorney, Agent, or Firm* — Dickinson Wright, PLLC

(57) ABSTRACT

The present disclosure provides a method for producing a semiconductor element that can lower the potential risk of malfunction. The production method of the disclosure is a method for producing a semiconductor element which includes providing a semiconductor element precursor, the precursor having a metal electrode layer formed on the surface of a gallium oxide-based single crystal semiconductor layer and a dopant doped in at least part of an exposed portion on the surface of the gallium oxide-based single crystal semiconductor layer where the metal electrode layer is not layered, and annealing treatment of the semiconductor element precursor whereby the dopant is diffused to a portion of the gallium oxide-based single crystal semiconductor layer that are overlapping with the metal electrode layer in the layering direction, to form a Schottky junction between the gallium oxide-based single crystal semiconductor layer and the metal electrode layer.

10 Claims, 12 Drawing Sheets

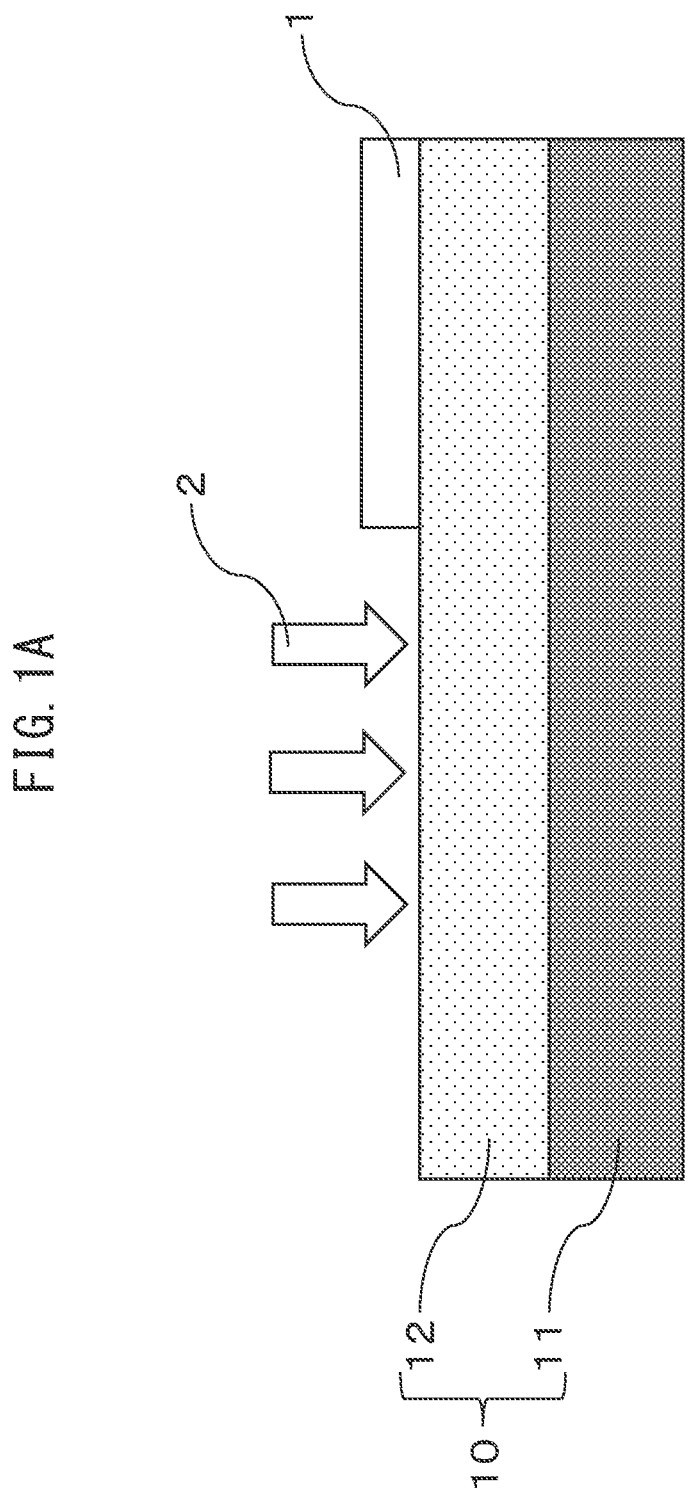

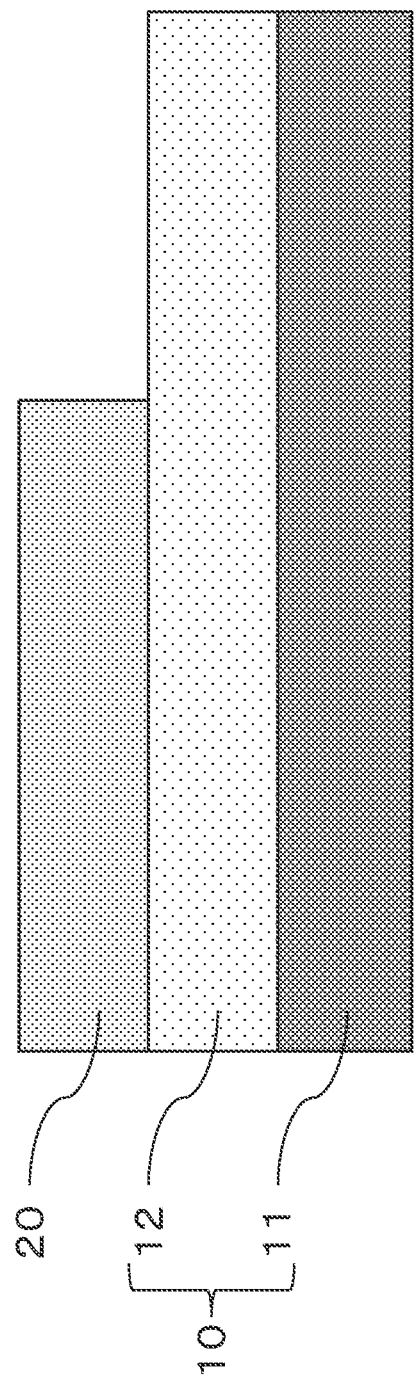

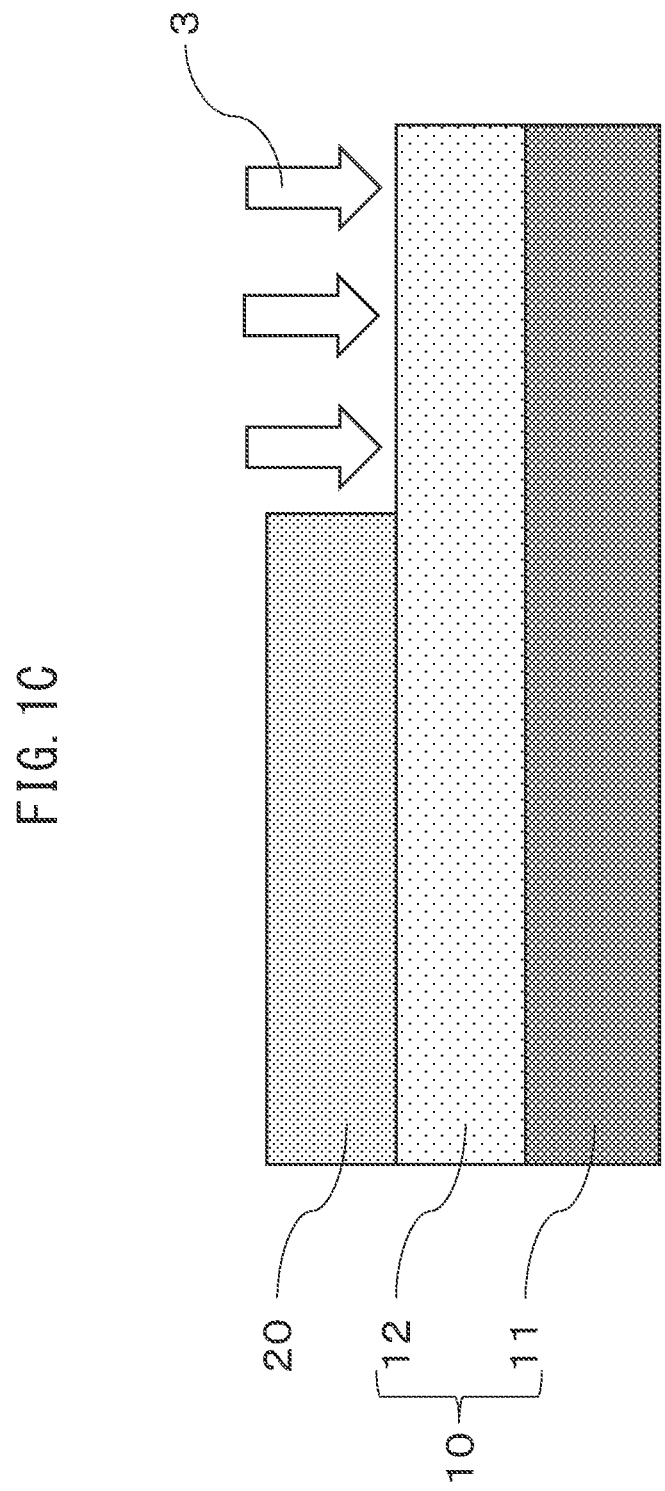

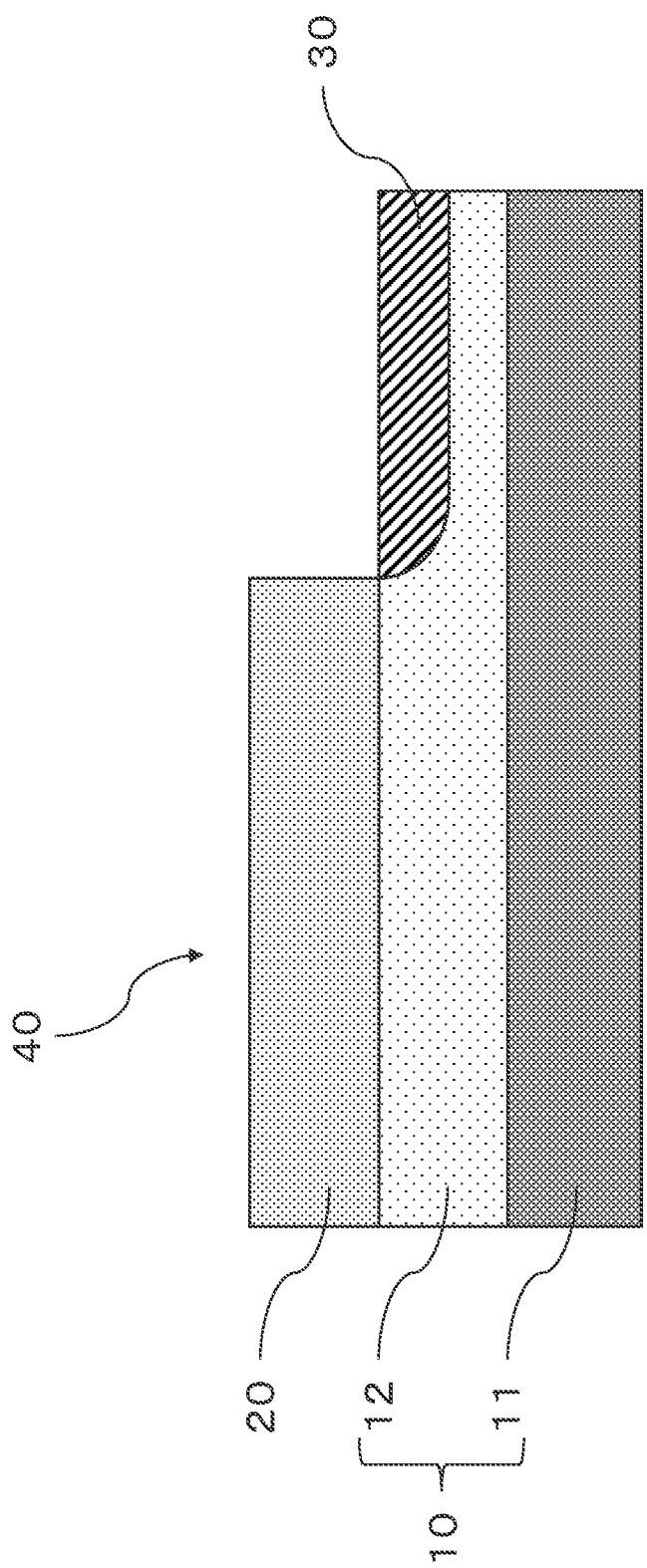

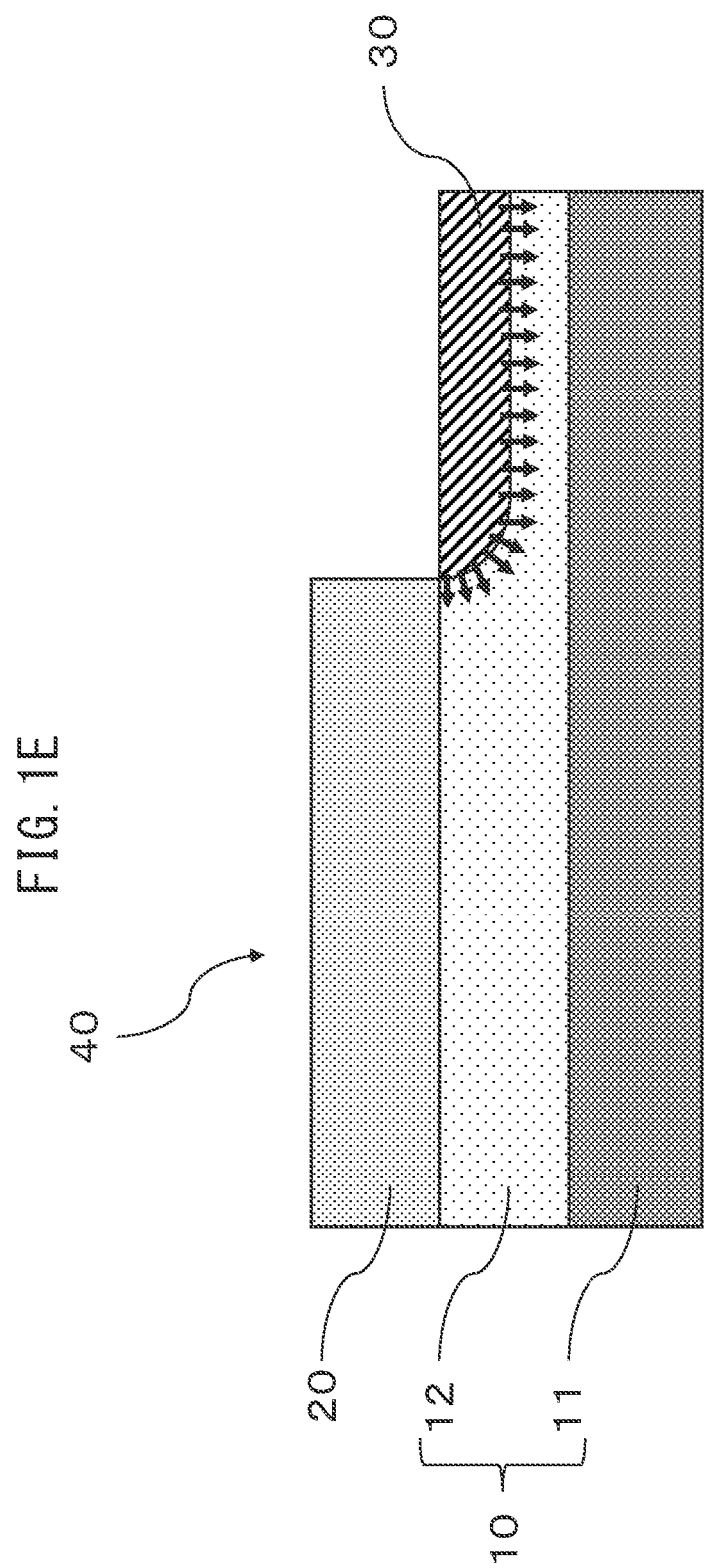

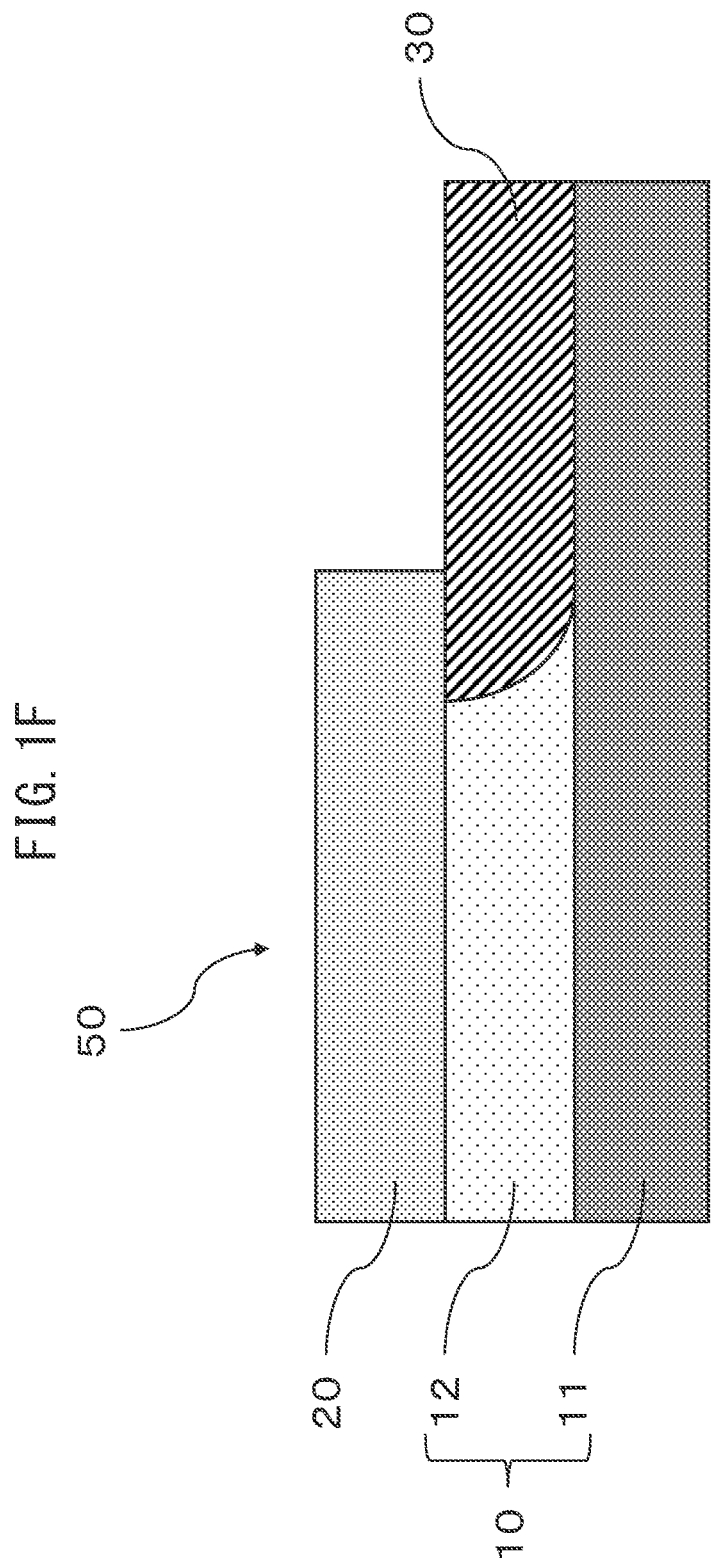

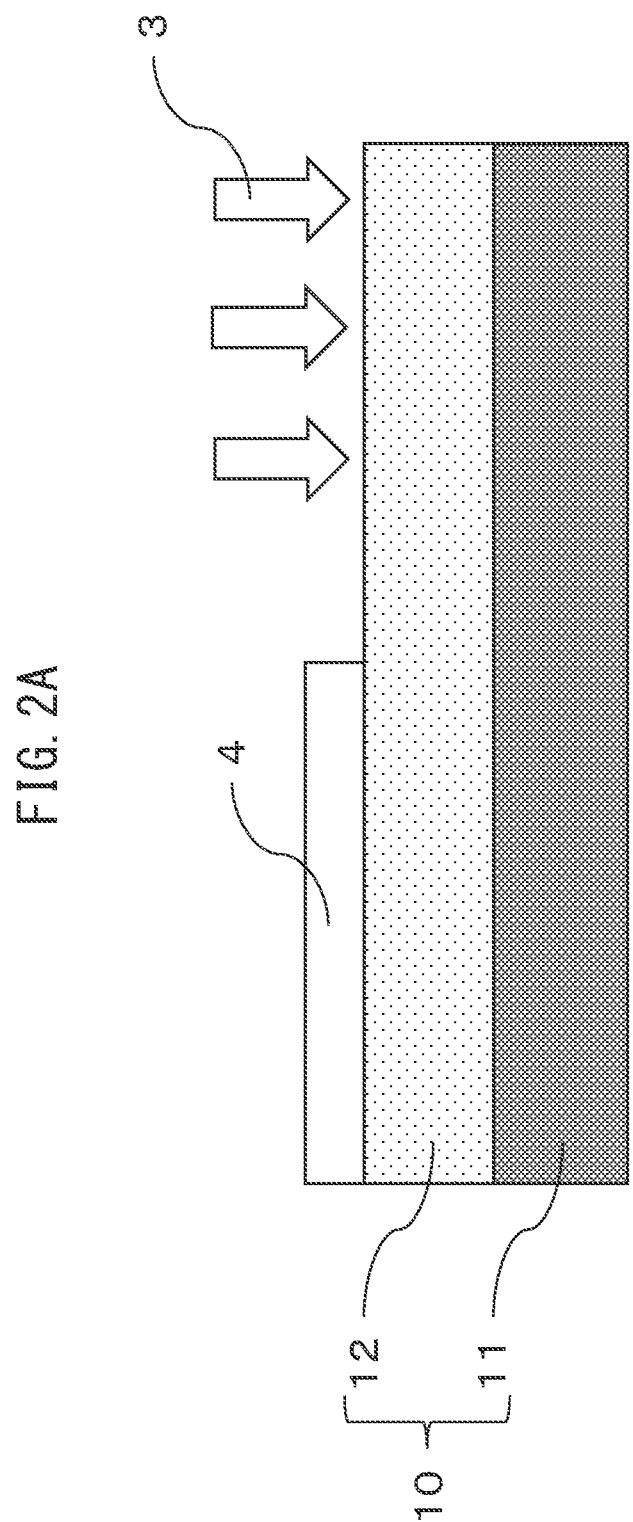

METHOD FOR PRODUCING SEMICONDUCTOR ELEMENT

FIELD

The present disclosure relates to a method for producing a semiconductor element.

BACKGROUND

Development is currently progressing in the area of power saving technologies, promising future power devices with reduced power loss. Power devices are mounted in many types of power converters, such as inverters that are mounted in hybrid vehicles and electric vehicles.

New wide-gap semiconductor materials such as SiC and GaN have become a focus of research with the goal of realizing low loss power devices and providing power devices with higher voltage resistance and lower loss than the current silicon (Si) types, and their research and development is being actively pursued. Gallium oxide, due to its physical properties such as a wider band gap than even SiC and GaN, is expected to provide even more excellent device properties such as high voltage resistance and low loss when applied in power devices.

PTL 1 discloses a method for producing a semiconductor element in which activated annealing is carried out after ion implantation of Mg into a gallium oxide single crystal layer, to form a high-resistance region, and then a metal electrode layer is situated over the high-resistance region.

CITATION LIST

Patent Literature

[PTL 1] Japanese Unexamined Patent Publication No. 2016-039194

SUMMARY

Technical Problem

When a gallium oxide-based single crystal semiconductor layer is doped with a dopant by ion implantation to form a high-resistance region, damage such as crystal defects can sometimes occur in the ion-implanted portion. Such damage is difficult to fully restore even by subsequent annealing treatment.

When the production method disclosed in PTL 1 is used, therefore, the metal electrode layer becomes situated on the surface of a gallium oxide-based single crystal semiconductor layer carrying such damage, and the damage can potentially result in malfunction.

It is an object of the present disclosure to provide a method for producing a semiconductor element that can lower this potential risk of malfunction.

Solution to Problem

The present inventors have found that the aforementioned object can be achieved by the following means:
<Aspect 1>
A method for producing a semiconductor element, which includes:
providing a semiconductor element precursor, the precursor having a metal electrode layer formed on the surface of a gallium oxide-based single crystal semiconductor layer, and a dopant doped in at least part of the exposed portion on the surface of the gallium oxide-based single crystal semiconductor layer where the metal electrode layer is not layered, and carrying out annealing treatment of the semiconductor element precursor, whereby the dopant is diffused to a portion of the gallium oxide-based single crystal semiconductor layer that are overlapping with the metal electrode layer in the layering direction.
<Aspect 2>
The method according to aspect 1, wherein providing the semiconductor element precursor includes:
layering the metal electrode layer on a portion of the surface of the gallium oxide-based single crystal semiconductor layer, and
after the metal electrode layer has been layered, doping the dopant by ion implantation of the dopant into at least part of the exposed portion of the surface of the gallium oxide-based single crystal semiconductor layer where the metal electrode layer is not layered.
<Aspect 3>
The method according to aspect 2, which includes:
doping the dopant into at least the part of the exposed portion that is adjacent to the portion where the metal electrode layer is layered, by ion implantation of the dopant using at least a portion of the metal electrode layer as a mask.
<Aspect 4>
The method according to aspect 2 or 3, wherein the dose of the dopant that is ion-implanted into the gallium oxide-based single crystal semiconductor layer is $5 \times 10^{13}$ cm$^{-2}$ to $5 \times 10^{14}$ cm$^{-2}$.
<Aspect 5>
The method according to any one of aspects 1 to 4, wherein:
the gallium oxide-based single crystal semiconductor layer has a substrate layer and a drift layer formed on the substrate layer,
the metal electrode layer is formed on the surface of the drift layer, and
the dopant is doped into at least part of the exposed portion of the drift layer surface where the metal electrode layer is not layered.
<Aspect 6>
The method according to aspect 5, wherein the thickness of the drift layer is 0.5 μm to 20.0 μm.
<Aspect 7>
The method according to any one of aspects 1 to 6, wherein the metal electrode layer is a layer comprising one or more metals selected from the group consisting of Ti, Mo, Ni and Pt.
<Aspect 8>
The method according to any one of aspects 1 to 7, wherein the dopant is an acceptor.
<Aspect 9>
The method according to aspect 8, wherein the acceptor is Mg.
<Aspect 10>
The method according to any one of aspects 1 to 9, wherein the annealing treatment is carried out at a temperature of 1000° C. to 1200° C.

Advantageous Effects of Invention

According to the present disclosure it is possible to provide a method for producing a semiconductor element that can lower the potential risk of malfunction.

BRIEF DESCRIPTION OF DRAWINGS

FIG. 1A is a schematic diagram showing a state where deposition 2 of a metal electrode body layer 20 is being carried out on the surface of a gallium oxide-based single crystal semiconductor layer 10 in the production method according to an embodiment of the disclosure.

FIG. 1B is a schematic diagram showing a state after deposition 2 of the metal electrode body layer 20 in the production method according to an embodiment of the disclosure.

FIG. 1C is a schematic diagram showing a state where ion implantation 3 is being carried out on the surface of a gallium oxide-based single crystal semiconductor layer 10 in the production method according to an embodiment of the disclosure.

FIG. 1D is a schematic diagram showing a state after ion implantation 3 in the production method according to an embodiment of the disclosure.

FIG. 1E is a schematic diagram showing a state where annealing treatment is being carried out in the production method according to an embodiment of the disclosure.

FIG. 1F is a schematic diagram showing a semiconductor element 50 produced by the production method according to an embodiment of the disclosure.

FIG. 2A is a schematic diagram showing a state where ion implantation 3 is being carried out on the surface of a gallium oxide-based single crystal semiconductor layer 10 in a different production method from the embodiment of the disclosure.

DESCRIPTION OF EMBODIMENTS

Figure 2B:
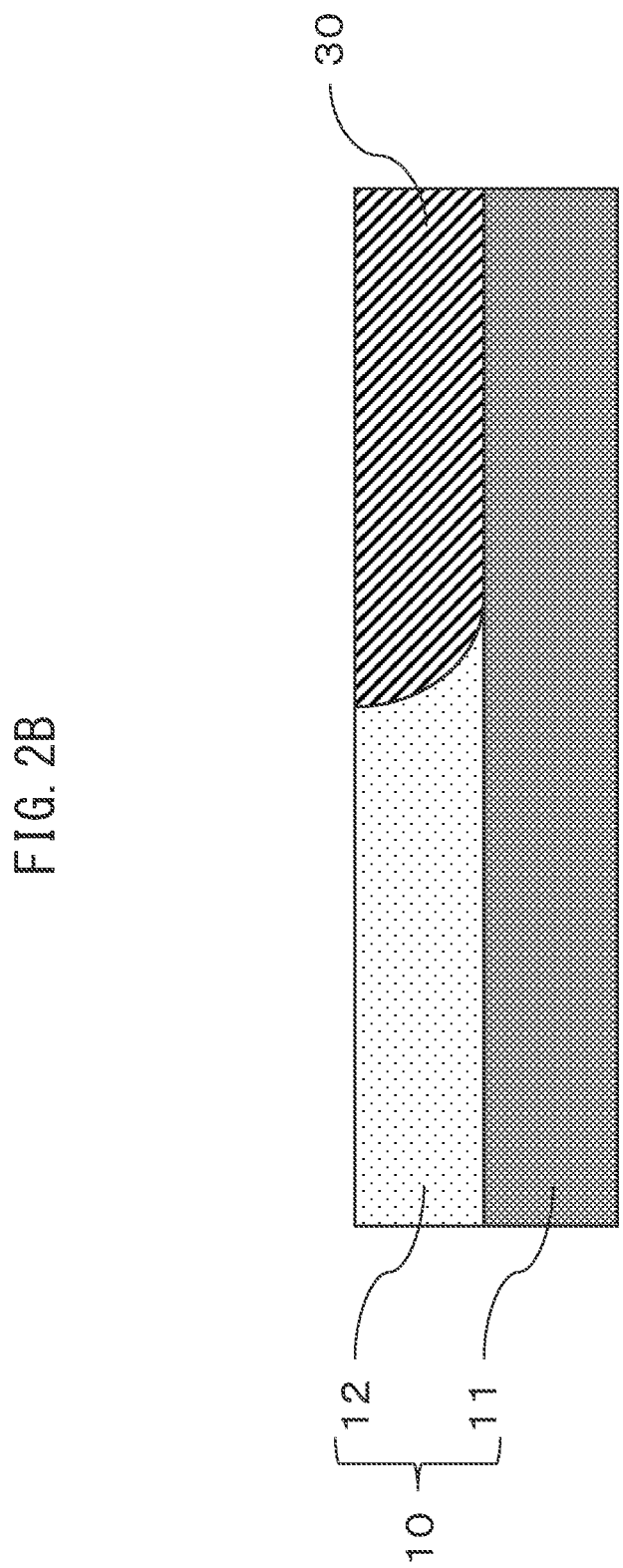
FIG. 2B is a schematic diagram showing a state after ion implantation 3 and after annealing treatment in a different production method from the embodiment of the disclosure.

Embodiments of the disclosure will now be described in detail. The disclosure is not limited to the embodiments described below, however, and various modifications may be implemented which do not depart from the gist thereof.

The production method of the disclosure is a method for producing a semiconductor element, which includes providing a semiconductor element precursor, the precursor having a metal electrode layer formed on the surface of a gallium oxide-based single crystal semiconductor layer and having a dopant doped in at least part of the exposed portion on the surface of the gallium oxide-based single crystal semiconductor layer where the metal electrode layer is not layered, and annealing treatment of the semiconductor element precursor whereby the dopant is diffused to a portion of the gallium oxide-based single crystal semiconductor layer that are overlapping with the metal electrode layer in the layering direction, to form a Schottky junction between the gallium oxide-based single crystal semiconductor layer and the metal electrode layer.

For the purpose of the disclosure, "layering direction" means the layering direction of the gallium oxide-based single crystal semiconductor layer and the metal electrode layer.

The semiconductor element produced by the method of the disclosure may also have other layers, such as an another semiconductor layer or metal electrode layer, disposed on the side of the gallium oxide-based single crystal semiconductor layer opposite from the side on which the metal electrode layer 20 is layered.

The present inventors have found that when ion implantation is carried out in a gallium oxide-based single crystal semiconductor layer for doping of a dopant, and then annealing treatment is carried out at a predetermined temperature, the dopant diffuses throughout the gallium oxide-based single crystal semiconductor layer.

Based on this knowledge, the present inventors have further found that by providing a semiconductor element precursor having a metal electrode layer formed on the surface of a gallium oxide-based single crystal semiconductor layer, and having a dopant doped in at least part of the exposed portion on the surface of the gallium oxide-based single crystal semiconductor layer where the metal electrode layer is not layered, and subjecting the semiconductor element precursor to annealing treatment at a predetermined temperature, the dopant is diffused to a portion of the gallium oxide-based single crystal semiconductor layer that are overlapping with the metal electrode layer in the layering direction, thus forming high-resistance regions in that portion.

In the production method of the disclosure, the metal electrode layer of the semiconductor element precursor is disposed on the portion of the gallium oxide-based single crystal semiconductor layer that are not doped with the dopant. As a result of the annealing treatment, the dopant diffuses to a portion of the gallium oxide-based single crystal semiconductor layer that are overlapping with the metal electrode layer in the layering direction, forming high-resistance regions in that portion.

This therefore differs from formation of a metal electrode layer on high-resistance regions as disclosed in PTL 1, in that it is possible to form a high-resistance region in the portion of the gallium oxide-based single crystal semiconductor layer that are overlapping with the metal electrode layer in the layering direction, while reducing the risk of malfunction due to damage produced in the gallium oxide-based single crystal semiconductor layer with doping of the dopant by ion implantation.

This will now be explained in greater detail with reference to FIGS. 1A to F.

FIGS. 1A to F are schematic diagrams illustrating a production method according to an embodiment of the disclosure.

In the production method according to this embodiment of the disclosure, a semiconductor element precursor is provided by carrying out the series of steps shown in FIGS. 1A to D, after which the annealing treatment shown in FIG. 1E is carried out to obtain the semiconductor element shown in FIG. 1F.

For provision of the semiconductor element precursor in the production method of this embodiment of the disclosure, the gallium oxide-based single crystal semiconductor layer 10 used has a substrate layer 11 and a drift layer 12 disposed on the substrate layer 11, as shown in FIG. 1A.

For provision of the semiconductor element precursor, as shown in FIG. 1A, first a deposition resist mask 1 for forming the metal electrode layer 20 is placed on the surface of the drift layer 12, and a film 2 is formed from the metal electrode layer 20 by vapor deposition.

The deposition resist mask 1 is then released, as shown in FIG. 1B.

Next, as shown in FIG. 1C, the metal electrode layer 20 layered on the surface of the drift layer 12 is used as an ion implantation resist mask for ion implantation 3 of the dopant. This dopes the dopant into at least part of the exposed portion where the metal electrode layer 20 is not layered, as shown in FIG. 1D, forming a high-resistance region 30.

A semiconductor element precursor 40 is thus provided, having the metal electrode layer 20 formed on the surface of the drift layer 12, and having the high-resistance region 30 formed on at least part of the exposed portion of the surface of the drift layer 12 where the metal electrode layer 20 is not layered.

Next, as shown in FIG. 1E, the semiconductor element precursor 40 is subjected to annealing treatment at a predetermined temperature. This causes the dopant that is doped on the drift layer 12 to diffuse into the parts of the drift layer 12 that are overlapping with the metal electrode layer 20 in the layering direction, as indicated by the black arrows. The high-resistance region 30 overlaps with the metal electrode layer 20 in the layering direction.

A semiconductor element 50 such as shown in FIG. 1F is thus produced. The semiconductor element 50 may also have other layers such as an another semiconductor layer or metal electrode layer, disposed on the side opposite from the side on which the metal electrode layer 20 is layered, i.e. on the substrate layer 11 side, although this is not shown in FIG. 1F.

In the production method of this embodiment of the disclosure, the metal electrode layer 20 is disposed at a location on the side of the drift layer 12 of the gallium oxide-based single crystal semiconductor layer 10 where ion implantation 3 is not carried out. The annealing treatment causes the dopant to diffuse into the parts of the drift layer 12 that are overlapping with the metal electrode layer 20 in the layering direction. The high-resistance region 30 thus overlaps with the metal electrode layer 20 in the layering direction. The portion of the drift layer 12 that overlaps with the metal electrode layer 20 in the layering direction is therefore free of damage such as crystal defects.

Incidentally, FIGS. 1A to F are not intended to limit the production method of the disclosure.

Figure 2C:
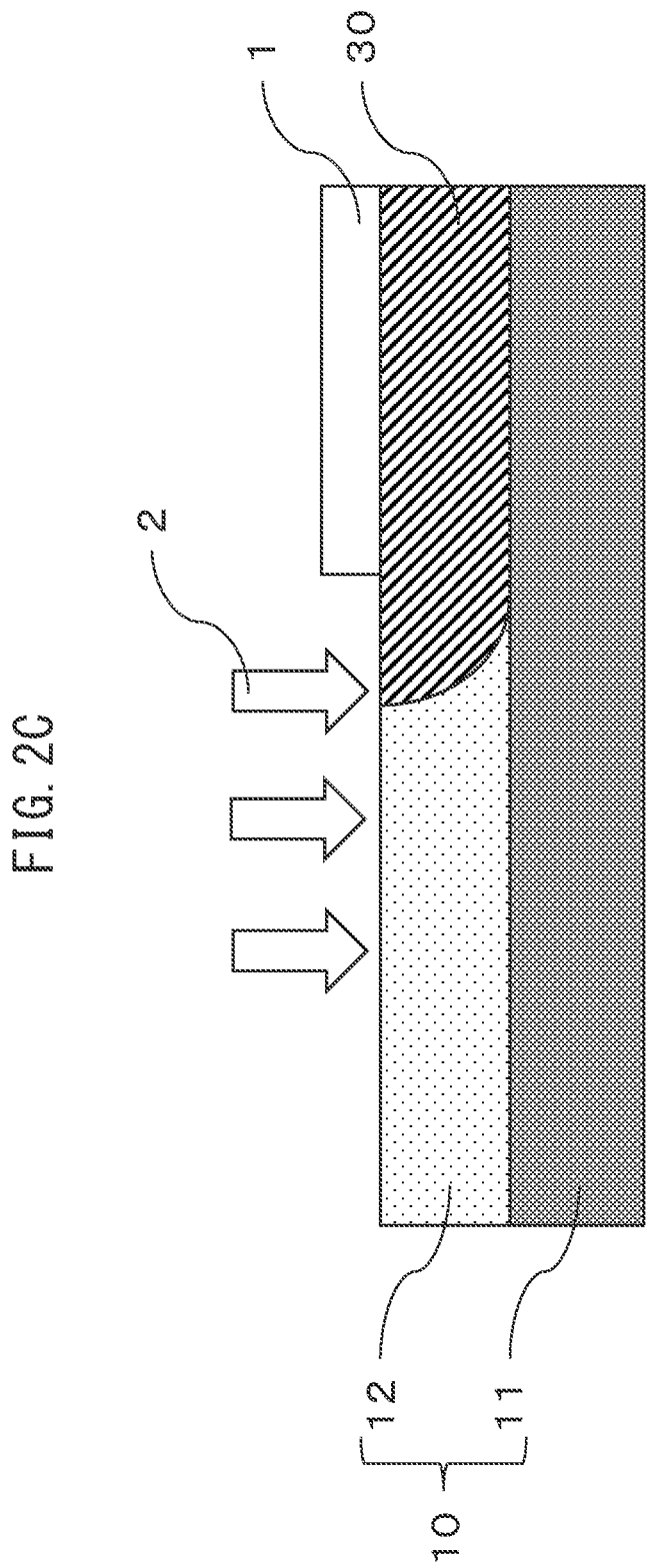
FIG. 2C is a schematic diagram showing the state where a metal electrode body layer 20 is deposited on the surface of a gallium oxide-based single crystal semiconductor layer 10 in a different production method from the embodiment of the disclosure.

A different production method from that of the embodiment of the disclosure can also be used to obtain a semiconductor element, by carrying out the series of steps illustrated in FIGS. 2A to C.

In this different production method from the embodiment of the disclosure, the gallium oxide-based single crystal semiconductor layer 10 used has a substrate layer 11 and a drift layer 12 disposed on the substrate layer 11, as shown in FIG. 2A. As also shown in the drawings, in this production method which is different from the embodiment of the disclosure, first the ion implantation resist mask 4 is situated on the surface of the drift layer 12, and the dopant is doped into the drift layer 12 by ion implantation. The ion implantation resist mask 4 is then released as shown in FIG. 2B, forming a high-resistance region 30 in the drift layer 12.

Next, as shown in FIG. 2C, a deposition resist mask 1 is placed over the drift layer 12 and deposition 2 of a metal electrode layer 20 is carried out by vapor deposition in such a manner that the metal electrode layer 20 is formed on the part of the surface of the drift layer 12 that overlaps with the high-resistance region 30.

The deposition resist mask 1 is then released to produce a semiconductor element 50 similar to the one shown in FIG. 1F.

When the production method illustrated in FIGS. 2A to C is used, a metal electrode layer 20 is formed on the surface of the portion overlapping with the high-resistance region 30, i.e. the portion where ion implantation has been carried out, and therefore the portion of the drift layer 12 overlapping with the metal electrode layer in the layering direction has damage including crystal defects.

<Provision of Semiconductor Element Precursor>

In the production method of the disclosure, the semiconductor element precursor is a material having a metal electrode layer formed on the surface of the gallium oxide-based single crystal semiconductor layer, and doped with a dopant in at least part of the exposed portions of the surface of the gallium oxide-based single crystal semiconductor layer where the metal electrode layer is not layered.

The semiconductor element precursor may be provided by using a previously fabricated one, or by fabricating one during the production method of the disclosure.

<Gallium Oxide-Based Single Crystal Semiconductor Layer>

The gallium oxide-based single crystal semiconductor layer is doped with a dopant in at least part of the exposed portion where the metal electrode layer is not layered.

The dopant may be any dopant that can be doped into the gallium oxide-based single crystal semiconductor layer. The dopant may also be an acceptor. Mg is an example of an acceptor, but there is no limitation to this example.

The gallium oxide-based single crystal semiconductor layer may be composed of an $\alpha$-$Ga_2O_3$ single crystal, a $\beta$-$Ga_2O_3$ single crystal or a $Ga_2O_3$ single crystal with a different crystalline structure, although a $\beta$-$Ga_2O_3$ single crystal is preferred.

The gallium oxide-based single crystal semiconductor layer may have a substrate layer and a drift layer formed on the substrate layer, the metal electrode layer may be formed on the surface of the drift layer, and the dopant may be doped into at least part of the exposed portion of the drift layer surface where the metal electrode layer is not layered.

The drift layer is a layer formed as a semiconductor element in which a drift current flows when used, and it can be formed by, for example, causing epitaxial growth on a substrate layer composed of a gallium oxide-based single crystal, by a known method.

The thickness of the drift layer may be 0.5 μm to 20.0 μm.

The thickness of the drift layer affects the degree of diffusion of the dopant in the in-plane direction during the annealing treatment. In the annealing treatment, the dopant diffuses mainly in the drift layer and tends not to diffuse in the substrate layer. By adjusting the thickness of the drift layer and the doping amount, therefore, it is possible to adjust the range of the high-resistance region in the in plane direction of the drift layer.

The thickness of the drift layer may be 0.5 µm or greater, 1.0 µm or greater, 2.5 µm or greater or 5.0 µm or greater, and 20.0 µm or smaller, 15.0 µm or smaller, 10.0 µm or smaller or 5.0 µm or smaller.

<Metal Electrode Layer>

The metal electrode layer is formed on the surface of the gallium oxide-based single crystal semiconductor layer. When the gallium oxide-based single crystal semiconductor layer has a substrate layer and a drift layer, the metal electrode layer is formed on the surface of the drift layer. The metal electrode layer is joined with the gallium oxide-based single crystal semiconductor layer, forming a Schottky junction.

The metal electrode layer may be formed of any material that can form a Schottky junction by being joined with the gallium oxide-based single crystal semiconductor layer, and that has a higher melting point than the annealing treatment temperature.

The metal electrode layer may be a layer of a metal with a melting point of 1000° C. or higher, for example, and more specifically it may be a layer composed of one or more metals selected from the group consisting of Ti, Mo, Ni and Pt.

<Production of Semiconductor Element Precursor>

Provision of the semiconductor element precursor in the production method of the disclosure may include layering the metal electrode layer on part of the surface of the gallium oxide-based single crystal semiconductor layer and, after the metal electrode layer has been layered, doping the dopant by ion implantation of the dopant into at least part of the exposed portion of the surface of the gallium oxide-based single crystal semiconductor layer where the metal electrode layer is not layered.

Incidentally, since the ion implantation is carried out after layering of the metal electrode layer during production of the semiconductor element precursor, it will be understood that the dopant that is doped into the gallium oxide-based single crystal semiconductor layer by ion implantation is not doped, or essentially not doped, in the portion of the gallium oxide-based single crystal semiconductor layer that are overlapping with the metal electrode layer in the layering direction.

(Layering of Metal Electrode Layer)

The method of layering the metal electrode layer may be any known method for forming a metal electrode layer of a semiconductor element, and more specifically a metal electrode layer that forms a Schottky junction with a semiconductor. Examples of such methods are known physical vapor deposition and chemical vapor deposition methods.

(Ion Implantation of Dopant)

The dopant may be used by ion implantation in at least part of the exposed portion where the metal electrode layer is not layered. The method of ion implantation of the dopant is not particularly restricted and may be any publicly known method.

The location of ion implantation of the dopant on the surface of the gallium oxide-based single crystal semiconductor layer preferably includes a portion adjacent to the metal electrode layer. When ion implantation of the dopant is carried out at such a location, the subsequent annealing treatment will cause the dopant to more easily diffuse to the parts of the gallium oxide-based single crystal semiconductor layer that overlap with the metal electrode layer in the layering direction, thus facilitating formation of the high-resistance region to those parts.

Ion implantation of the dopant may also be carried out by doping the dopant into at least a part of the exposed portion that is adjacent to the portion where the metal electrode layer is layered, using at least a portion of the metal electrode layer as a mask.

If the dopant is doped using a portion of the metal electrode layer as a mask, then it will be easier to dope the dopant into parts adjacent to the portion where the metal electrode layer is layered. This will facilitate diffusion of the dopant into the portion that are overlapping with the metal electrode layer in the layering direction in the subsequent annealing treatment, and will allow more precise control of the overlapping width between the metal electrode layer and high-resistance region.

Using a portion of the metal electrode layer as a mask can also reduce the number of steps for formation of the ion implantation resist mask, thereby increasing productivity.

The dose of the dopant implanted into the gallium oxide-based single crystal semiconductor layer may be $5 \times 10^{13}$ $cm^{-2}$ to $5 \times 10^{14}$ $cm^{-2}$.

The dose of the dopant affects the degree of diffusion of the dopant in the in-plane direction during the annealing treatment. In the annealing treatment, the dopant diffuses mainly into the drift layer and tends not to diffuse into the substrate layer. By adjusting the thickness of the drift layer and the doping amount, therefore, it is possible to adjust the range to which the drift layer extends in the in-plane direction of the high-resistance region.

The dose of the dopant implanted into the gallium oxide-based single crystal semiconductor layer may be $5 \times 10^{13}$ $cm^{-2}$ or greater, $6 \times 10^{13}$ $cm^{-2}$ or greater or $7 \times 10^{13}$ $cm^{-2}$ or greater, and $5 \times 10^{14}$ $cm^{-2}$ or lower, $4 \times 10^{14}$ $cm^{-2}$ or lower, $3 \times 10^{14}$ $cm^{-2}$ or lower or $2 \times 10^{14}$ $cm^{-2}$ or lower.

<Annealing Treatment>

In the production method of the disclosure, the semiconductor element precursor is subjected to annealing treatment, thereby causing diffusion of the dopant into the portion of the gallium oxide-based single crystal semiconductor layer that are overlapping with the metal electrode layer in the layering direction.

The conditions for annealing treatment are a temperature and time such that the dopant to be doped into the gallium oxide-based single crystal semiconductor layer diffuses up to the portion that are overlapping with the metal electrode layer in the layering direction.

The temperature for annealing treatment may be 1000° C. or higher, for example. This is because an annealing treatment temperature of 1000° C. or higher will facilitate diffusion of the dopant deeper into the gallium oxide-based single crystal semiconductor layer.

The temperature for annealing treatment may be up to 1200° C. If the annealing treatment temperature is 1200° C. or lower it will be possible to cause diffusion of the dopant with the crystal structure of the gallium oxide-based single crystal semiconductor layer in a particularly stable state.

The annealing treatment temperature is therefore preferred to be 1000° C. to 1200° C.

The annealing treatment temperature may be 1000° C. or higher, 1050° C. or higher, 1100° C. or higher or 1150° C. or higher, and 1200° C. or lower, 1150° C. or lower, 1100° C. or lower or 1050° C. or lower.

The annealing treatment time is preferably 5 minutes or longer, more preferably 15 minutes or longer and more preferably 30 minutes or longer. If the annealing treatment time is in the range specified above it will be possible to cause more uniform diffusion of the dopant from the surface to the interior of the gallium oxide-based single crystal semiconductor layer.

While there is no particular upper limit for the annealing treatment time, it is preferably no longer than 3 hours from the viewpoint of productivity. The annealing treatment atmosphere may be a nitrogen atmosphere.

EXAMPLES

Example 1

<Sample Preparation>

A sample for Example 1 was prepared in the following manner.

A β-$Ga_2O_3$ single crystal plate was prepared as the gallium oxide-based single crystal semiconductor layer. The prepared $Ga_2O_3$ single crystal plate was a β-$Ga_2O_3$ single crystal layer formed as a drift layer by epitaxial growth on a β-$Ga_2O_3$ single crystal substrate. The thickness of the drift layer was 5.0 μm.

A vapor deposition method was used to form a Ni layer with a diameter of 500 μm as a metal electrode layer on the drift layer. The Ni layer was then used as an ion implantation mask for doping with Mg as the dopant, onto the exposed portion of the drift layer that included the part adjacent to the Ni layer in the layering direction. It was then subjected to annealing treatment for 30 minutes at 1000° C.

<Evaluation of Mg Diffusion State>

Dynamic secondary ion mass spectrometry (D-SIMS) was used to measure the state of Mg diffusion in the depthwise direction at a predetermined location of the drift layer immediately after ion implantation and after annealing treatment, for the sample of Example 1.

Figure 3:
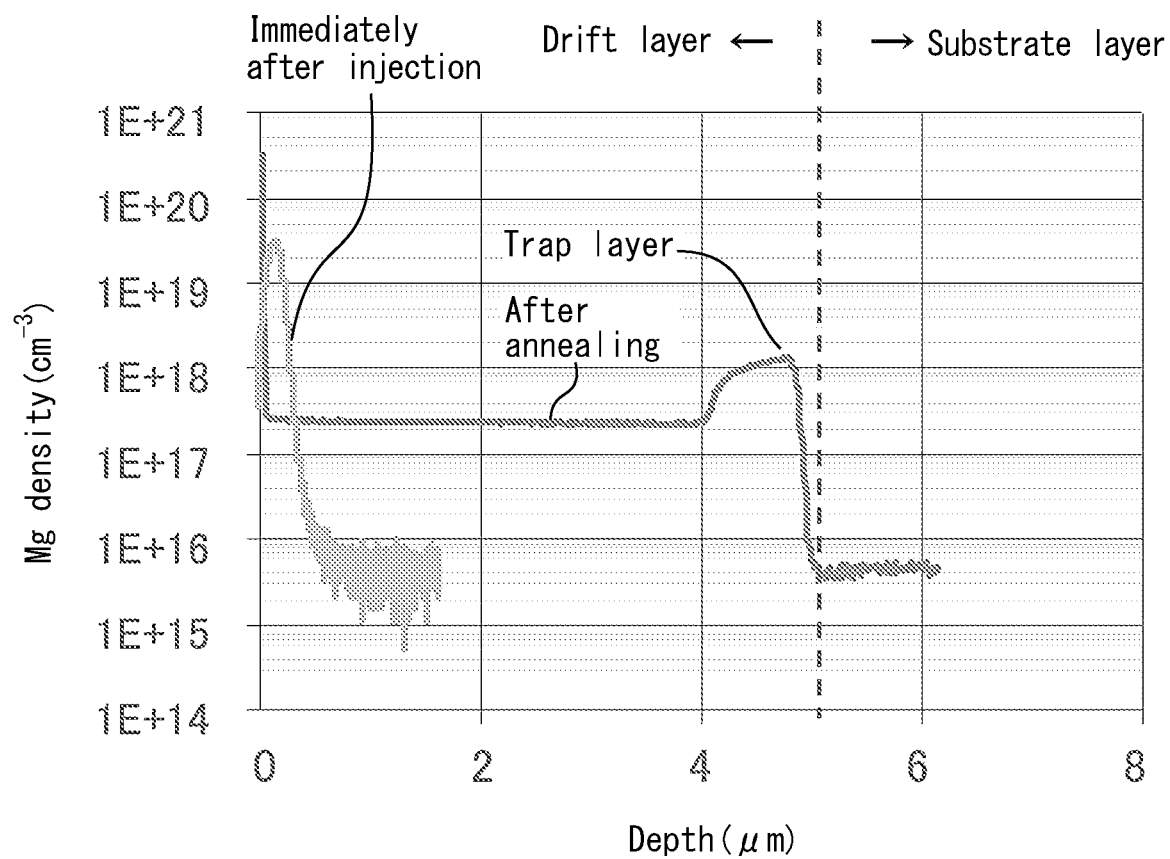
FIG. 3 is a graph showing the results for dynamic secondary ion mass spectrometry (D-SIMS) measurement of the state of Mg diffusion from the surface of the drift layer in the thickness direction immediately after ion implantation and after annealing treatment, for the sample of Example 1.

The measurement results are shown in FIG. 3.

As shown in FIG. 3, Mg was concentrated in a region at a depth of less than 1.0 μm from the surface of the drift layer, in the sample immediately after ion implantation. In the sample after annealing treatment, however, Mg was diffused from the surface of the drift layer up to a region at a depth of about 5.0 μm. This indicates that a high-resistance region with a thickness of about 5.0 μm had been formed in the sample after annealing treatment.

Next, dynamic secondary ion mass spectrometry (D-SIMS) was used to measure the state of Mg diffusion in the depthwise direction from the surface of the drift layer at a point 25 μm inward in the in-plane direction from the edge of the metal electrode body layer at the exposed portion, as well as the state of Mg diffusion in the depthwise direction from the surface of the drift layer, for the annealed sample of Example 1.

Figure 4:
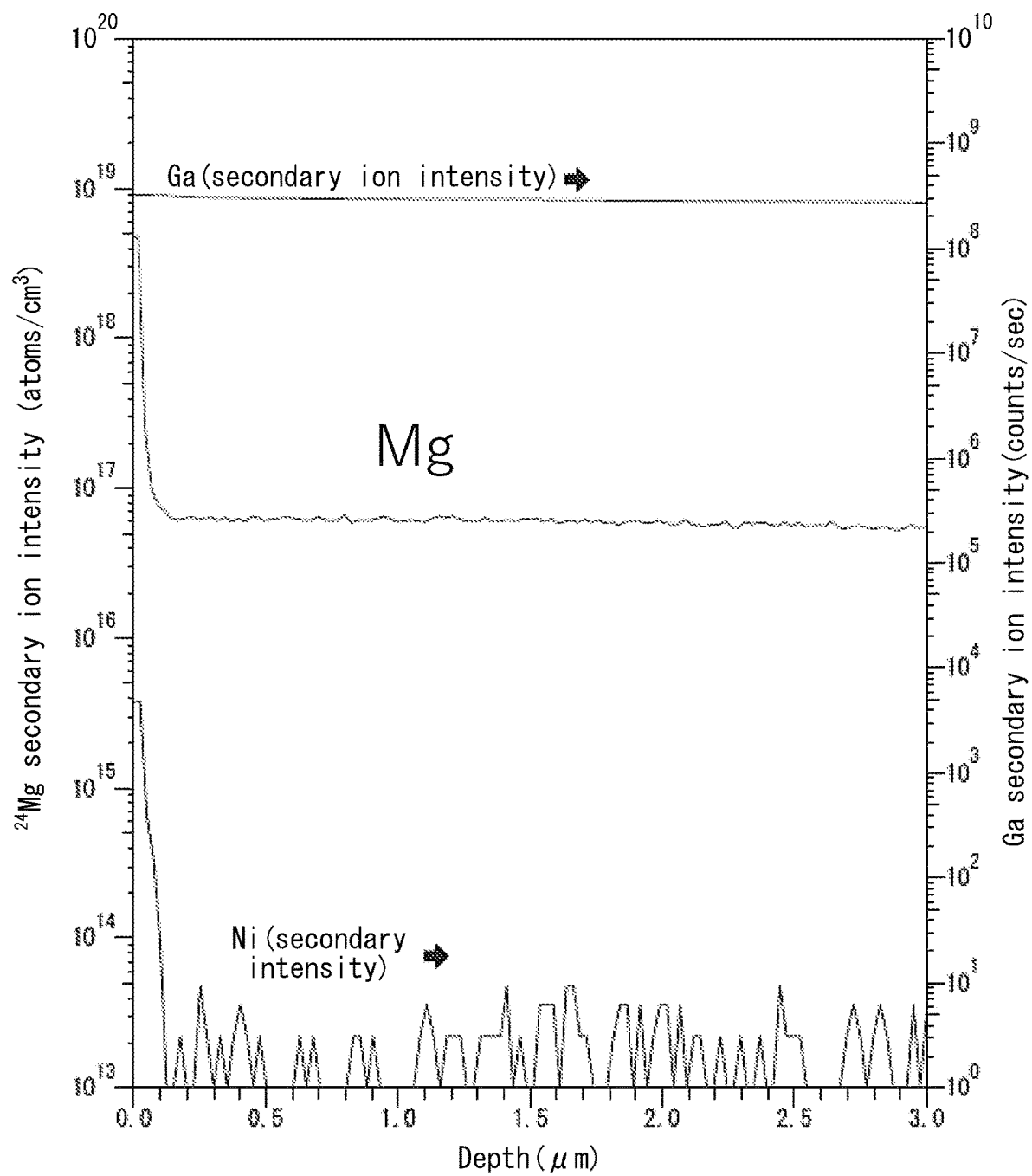
FIG. 4 is a graph showing the results for dynamic secondary ion mass spectrometry (D-SIMS) measurement of the state of Mg diffusion from the surface of the drift layer in the thickness direction of the exposed portion of the sample of Example 1.
Figure 5:
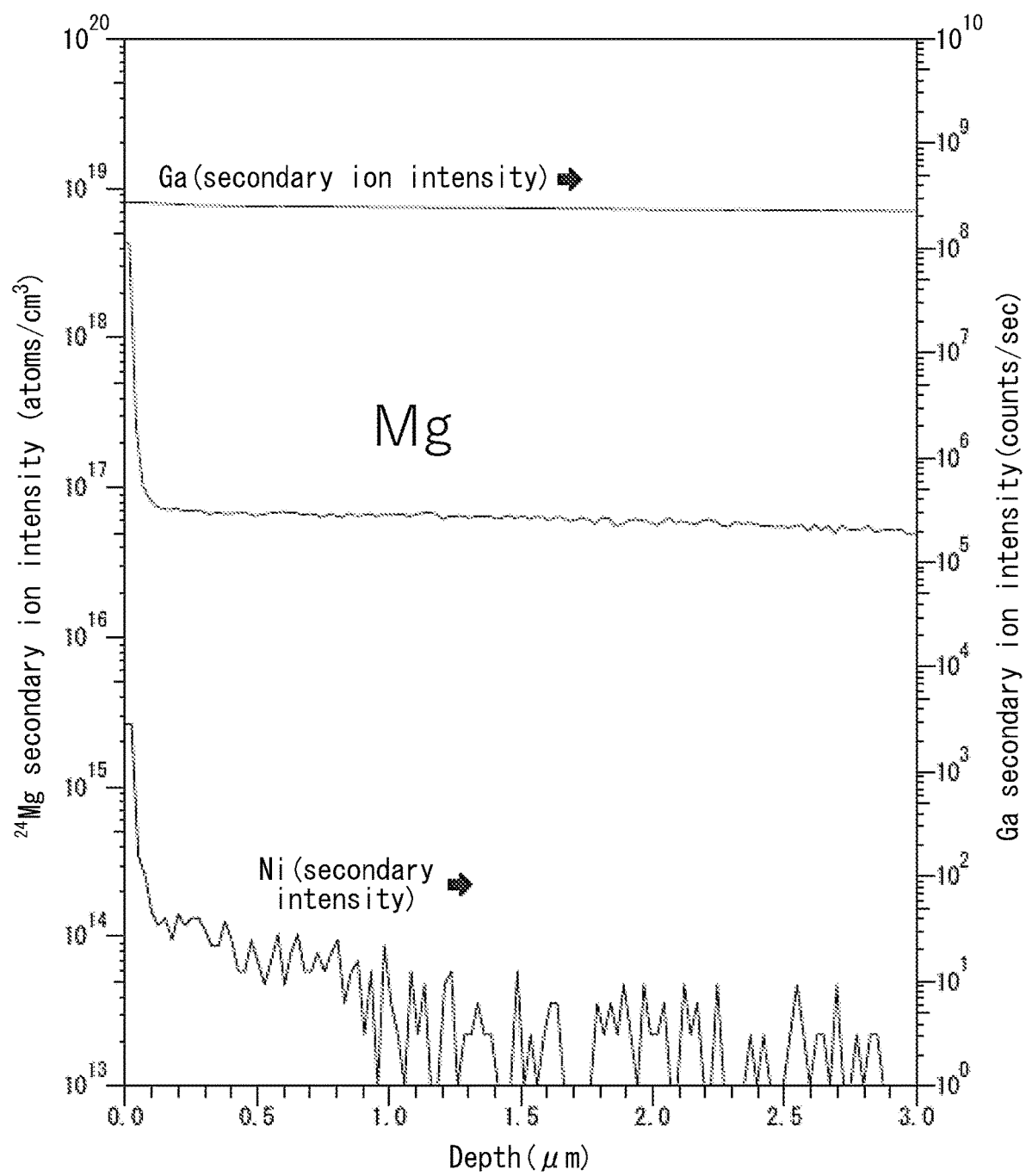
FIG. 5 is a graph showing the results for dynamic secondary ion mass spectrometry (D-SIMS) measurement of the state of Mg diffusion from the surface of the drift layer in the thickness direction, at a point 25 μm inward in the in-plane direction from the edge of the metal electrode body layer, for the sample of Example 1.

The measurement results are shown in FIGS. 4 and 5.

FIGS. 4 and 5 are graphs showing the results for dynamic secondary ion mass spectrometry (D-SIMS) measurement of, respectively, the state of Mg diffusion in the depthwise direction from the surface of the drift layer, and the state of Mg diffusion in the depthwise direction from the surface of the drift layer at a point 25 μm inward in the in-plane direction from the edge of the metal electrode body layer, at the exposed portion of the sample of Example 1.

As shown in FIG. 4 and FIG. 5, the state of diffusion of Mg in the depthwise direction at a point 25 μm inward in the in-plane direction from the edge of the metal electrode body layer of the annealed sample of Example 1 was approximately the same as the state of diffusion of Mg in the depthwise direction at the exposed portion, with Mg having diffused at least up to near 3.0 in the depthwise direction from the surface of the drift layer at all locations.

This result indicates that annealing treatment resulted in diffusion of Mg up to the section of the drift layer below the metal electrode body layer, or in other words, that a high-resistance region had formed up to the section of the drift layer below the metal electrode body layer.

In FIG. 4 and FIG. 5, the concentration of Mg near 0.1 μm from the surface of the drift layer in the depthwise direction was especially high, but this is attributed to the effects of surface accretion on the drift layer that was present before formation of the metal electrode body layer film.

REFERENCE SIGNS LIST

1 Deposition resist mask
2 Deposition
3 Ion implantation
4 Ion implantation resist mask
10 Gallium oxide-based single crystal semiconductor layer
11 Substrate layer
12 Drift layer
20 Metal electrode layer
30 High-resistance region
40 Semiconductor element precursor
50 Semiconductor element

The invention claimed is:

1. A method for producing a semiconductor element, which includes:
   providing a semiconductor element precursor, the precursor having a metal electrode layer formed on the surface of a gallium oxide-based single crystal semiconductor layer, and a dopant doped in at least part of the exposed portion on the surface of the gallium oxide-based single crystal semiconductor layer where the metal electrode layer is not layered, and
   carrying out annealing treatment of the semiconductor element precursor, whereby the dopant is diffused to a portion of the gallium oxide-based single crystal semiconductor layer that is overlapping with the metal electrode layer in the layering direction.

2. The method according to claim 1, wherein providing the semiconductor element precursor includes:
   layering the metal electrode layer on a portion of the surface of the gallium oxide-based single crystal semiconductor layer, and
   after the metal electrode layer has been layered, doping the dopant by ion implantation of the dopant into at least part of the exposed portion of the surface of the gallium oxide-based single crystal semiconductor layer where the metal electrode layer is not layered.

3. The method according to claim 2, which includes:
   doping the dopant into at least the part of the exposed portion that is adjacent to the portion where the metal electrode layer is layered, by ion implantation of the dopant using at least a portion of the metal electrode layer as a mask.

4. The method according to claim 2, wherein the dose of the dopant that is ion-implanted into the gallium oxide-based single crystal semiconductor layer is $5\times10^{13}$ $cm^{-2}$ to $5\times10^{14}$ $cm^{-2}$.

5. The method according to claim 1, wherein:
   the gallium oxide-based single crystal semiconductor layer has a substrate layer and a drift layer formed on the substrate layer,
   the metal electrode layer is formed on the surface of the drift layer, and
   the dopant is doped into at least part of the exposed portion of the drift layer surface where the metal electrode layer is not layered.

6. The method according to claim 5, wherein the thickness of the drift layer is 0.5 μm to 20.0 μm.

7. The method according to claim 1, wherein the metal electrode layer is a layer comprising one or more metals selected from the group consisting of Ti, Mo, Ni and Pt.

8. The method according to claim 1, wherein the dopant is an acceptor.

9. The method according to claim 8, wherein the acceptor is Mg.

10. The method according to claim 1, wherein the annealing treatment is carried out at a temperature of 1000° C. to 1200° C.

* * * * *